(12) United States Patent
Salman et al.

(10) Patent No.: US 9,099,523 B2
(45) Date of Patent: Aug. 4, 2015

(54) ESD PROTECTION CIRCUIT WITH ISOLATED SCR FOR NEGATIVE VOLTAGE OPERATION

(71) Applicant: Texas Instruments Incorporated, Dallas, TX (US)

(72) Inventors: Akram A. Salman, Plano, TX (US); Farzan Farbiz, Dallas, TX (US); Amitava Chatterjee, Plano, TX (US); Xiaoju Wu, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/668,022

(22) Filed: Nov. 2, 2012

(65) Prior Publication Data

US 2014/0124828 A1 May 8, 2014

(51) Int. Cl.
*H01L 29/74* (2006.01)
*H01L 27/02* (2006.01)

(52) U.S. Cl.
CPC ........ *H01L 29/7436* (2013.01); *H01L 27/0262* (2013.01)

(58) Field of Classification Search
CPC ............ H01L 27/0266; H01L 27/0255; H01L 27/0251; H01L 27/0262; H01L 27/0259
USPC .................................................. 257/133, 355
See application file for complete search history.

(56) References Cited

U.S. PATENT DOCUMENTS

| 5,889,315 | A | * | 3/1999 | Farrenkopf et al. | 257/552 |
|---|---|---|---|---|---|
| 6,765,771 | B2 | | 7/2004 | Ket et al. | |
| 7,601,991 | B2 | | 10/2009 | Salcedo et al. | |
| 7,719,026 | B2 | | 5/2010 | Lou et al. | |
| 8,193,560 | B2 | | 6/2012 | Gendron et al. | |
| 2002/0050615 | A1 | * | 5/2002 | Ker et al. | 257/355 |
| 2007/0131965 | A1 | | 6/2007 | Kim et al. | |
| 2011/0049621 | A1 | * | 3/2011 | Lotfi et al. | 257/337 |
| 2012/0092798 | A1 | | 4/2012 | Hwang | |

* cited by examiner

*Primary Examiner* — Hoai V Pham
*Assistant Examiner* — Long Le
(74) *Attorney, Agent, or Firm* — Jacqueline J. Garner; Frank D. Cimino (57) ABSTRACT

A semiconductor controlled rectifier comprises a first lightly doped region (100) having a first conductivity type (N) and a first heavily doped region (108) having a second conductivity type (P) formed within the first lightly doped region. A second lightly doped region (104) having the second conductivity type is formed proximate the first lightly doped region. A second heavily doped region (114) having the first conductivity type is formed within the second lightly doped region. A buried layer (101) having the first conductivity type is formed below the second lightly doped region and electrically connected to the first lightly doped region. A third lightly doped region (102) having the second conductivity type is formed between the second lightly doped region and the buried layer. A fourth lightly doped region (400) having the second conductivity type is formed between the second lightly doped region and the buried layer.

8 Claims, 7 Drawing Sheets

ESD PROTECTION CIRCUIT WITH ISOLATED SCR FOR NEGATIVE VOLTAGE OPERATION

BACKGROUND OF THE INVENTION

Embodiments of the present embodiments relate to an isolated semiconductor controlled rectifier (SCR) circuit for electrostatic discharge (ESD) protection. A preferred embodiment of the circuit is intended for use at input, output, or input-output terminals having a negative operating voltage with respect to GND or VSS, but the circuit may also be used between power supply terminals such as VDD and GND or VSS terminals of an integrated circuit.

Figure 1:
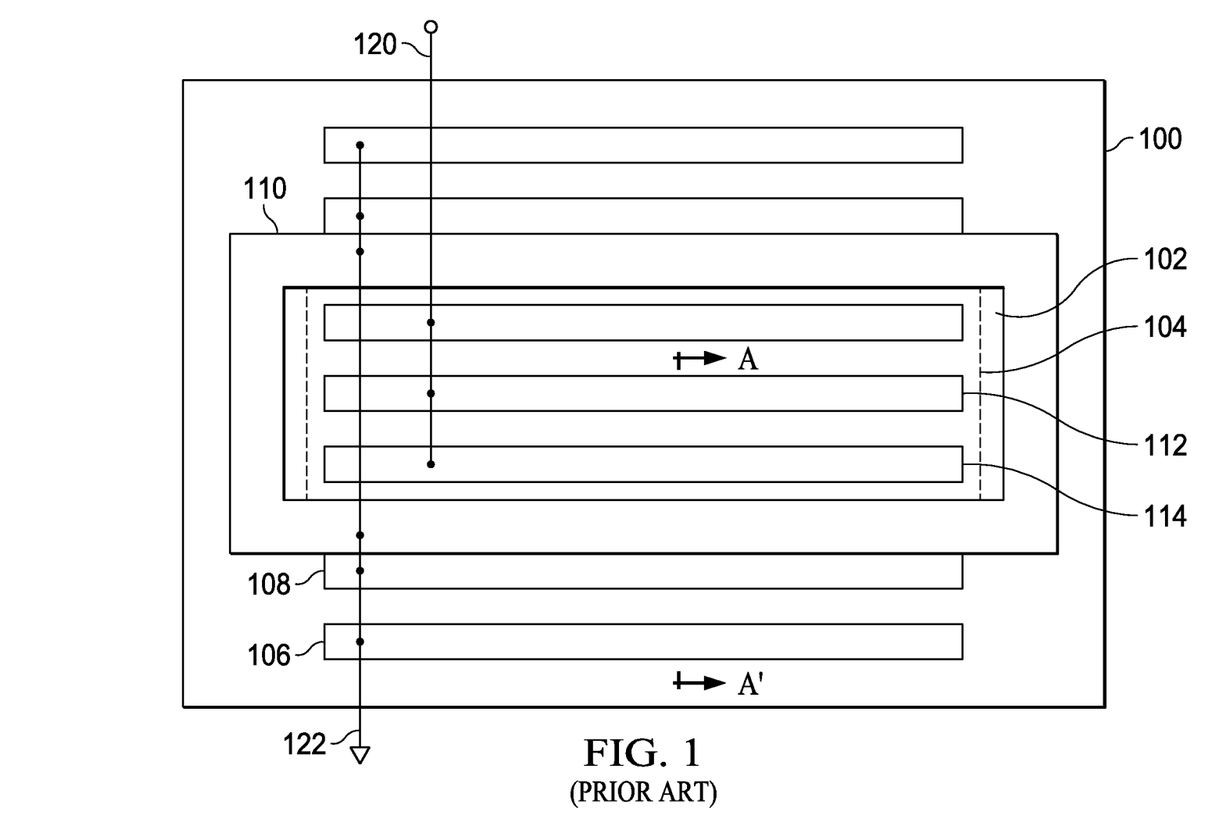
FIG. 1 is a plan view of an enclosed semiconductor controlled rectifier (SCR) of an electrostatic discharge (ESD) protection circuit of the prior art.
Figure 2:
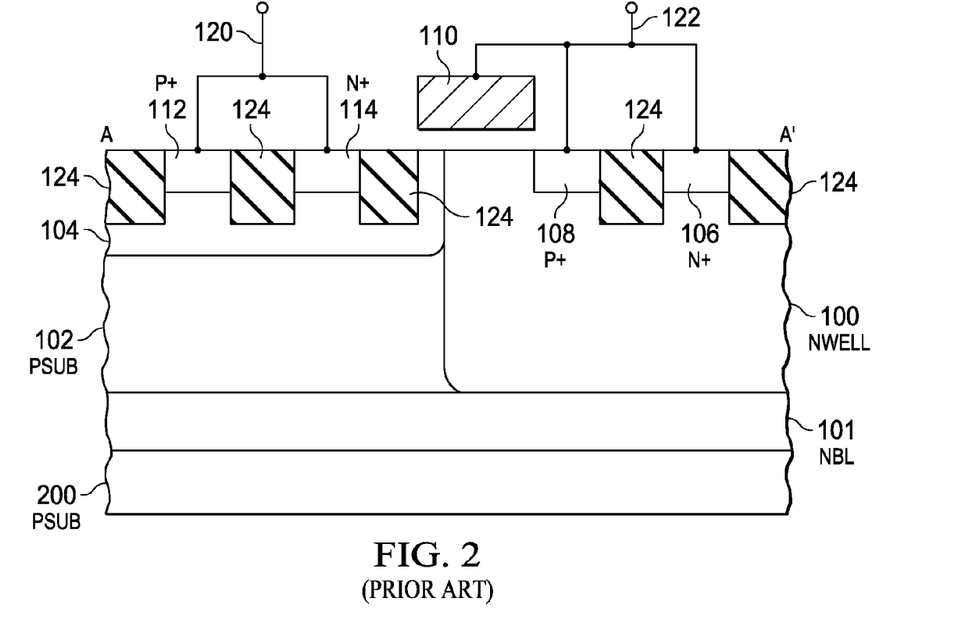
FIG. 2 is a cross sectional diagram along the plane A-A' of the SCR of FIG. 1.
Figure 3:
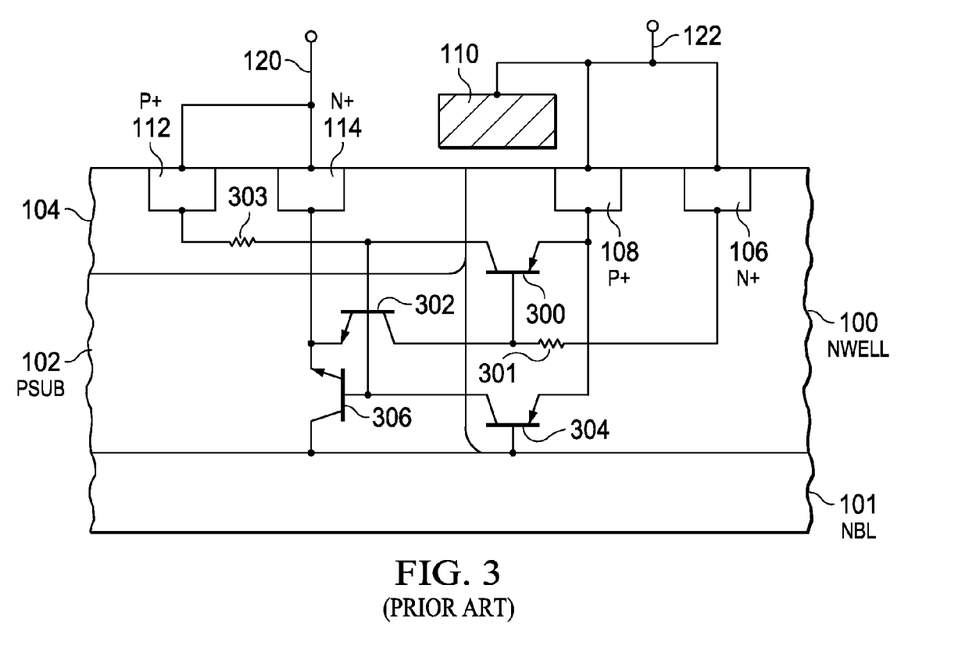
FIG. 3 is a schematic diagram showing individual transistors of the SCR of FIG. 2.

Referring to FIGS. 1-3, there is an ESD protection circuit of the prior art that is similar to those disclosed by Ker et al. in U.S. Pat. No. 6,765,771. The plan view of FIG. 1 illustrates a dual semiconductor controlled rectifier formed on p-type substrate (PSUB) 102 and surrounded by n-type well (NWELL) 100. The PSUB layer 102 is electrically connected to P+ region 112. The dual SCRs are formed symmetrically above and below P+ region 112, so only the lower SCR will be described in detail. Here and in the following discussion the same reference numerals are used to identify the same or similar circuit elements in the various drawing figures. N+ region 114 is the cathode of the lower SCR and is formed adjacent P+ region 112 within p-type well region 104. P+ region 108 is formed within NWELL 100 and serves as an anode for the lower SCR. N+ region 106 is electrically connected to NWELL 100. Gate region 110 is formed over a boundary between NWELL 100 and PSUB 102. Gate region 110, P+ anode 108, and N+ region 106 are electrically connected to reference terminal 122, which is preferably GND or VSS. P+ region 112 and N+ region 114 are electrically connected to terminal 120, which is preferably an input, output, or input-output terminal to be protected.

Referring next to FIG. 2, there is a cross sectional diagram of the lower SCR along the plane A-A' as indicated by the line in FIG. 1. The SCR is formed on P-type substrate (PSUB) 200. N-type buried layer (NBL) 101 is formed in PSUB 200 below the surface by ion implantation. Taken together n-type well (NWELL) 100 and NBL 101 form an isolated P-type region (PSUB) 102. The lower SCR includes P+ anode 108 formed in NWELL 100 and N+ cathode 114 formed in p-type well region 104. Active P+ regions 112 and 108, N+ regions 114 and 106, and the channel region below gate 110 are separated by shallow trench isolation (STI) regions 124.

Turning now to FIG. 3, there is a simplified diagram of the SCR of FIG. 2 showing individual bipolar transistors. Shallow trench isolation (STI) regions are omitted for clarity. The lower SCR of FIG. 2 comprises a vertical SCR and a horizontal SCR. The vertical SCR includes PNP transistor 304 and NPN transistor 306 and forms a vertical current path from P+ anode 108 to NBL 101 via NWELL 100 and back to N+ cathode 114 via PSUB 102. The horizontal SCR includes PNP transistor 300 and NPN transistor 302 and forms a horizontal current path directly from P+ anode 108 to N+ cathode 114. Parasitic resistor 301 is a base-emitter shunt resistor for PNP transistor 300. Parasitic resistor 303 is a base-emitter shunt resistor for NPN transistors 302 and 306.

Several problems arise with operation of the SCR of FIGS. 1-3 that limit operating voltage, gain of the SCR, and introduce reliability problems as will become apparent in the following discussions. Various embodiments of the present invention are directed to solving these problems and improving operation of the SCR without increasing process complexity.

BRIEF SUMMARY OF THE INVENTION

In a preferred embodiment of the present invention, a semiconductor controlled rectifier for protecting an integrated circuit is disclosed. The semiconductor controlled rectifier includes a first lightly doped region having a first conductivity type formed proximate a second lightly doped region having a second conductivity type. A first heavily doped region having the second conductivity type is formed within the first lightly doped region. A second heavily doped region having the first conductivity type is formed within the second lightly doped region. A buried layer having the first conductivity type is formed below the second lightly doped region and electrically connected to the first lightly doped region. A third lightly doped region having the second conductivity type is formed between the second lightly doped region and the third heavily doped region. A fourth lightly doped region having the second conductivity type is formed between the second lightly doped region and the third heavily doped region and electrically connected to the second and third lightly doped regions.

DETAILED DESCRIPTION OF THE INVENTION

The preferred embodiments of the present invention provide significant advantages over electrostatic discharge (ESD) protection circuits of the prior art as will become evident from the following detailed description.

Figure 4A:
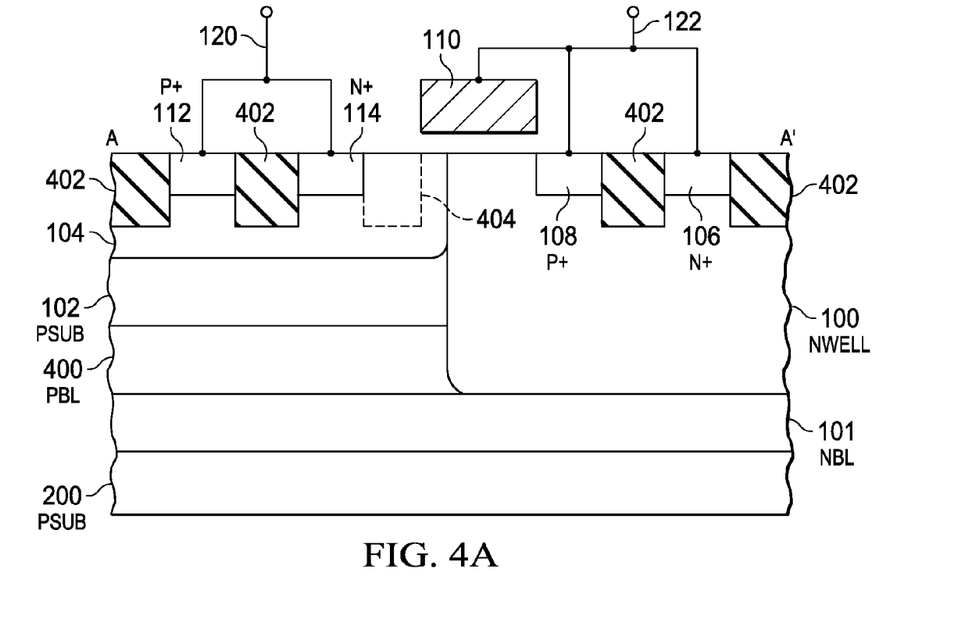
FIG. 4A is a cross sectional diagram of a first embodiment of an SCR of the present invention.

Referring to FIG. 4A, there is a cross sectional diagram of a first embodiment of a semiconductor controlled rectifier (SCR) of the present invention. Here and in the following discussion, SCR refers to a semiconductor controlled rectifier rather than a silicon controlled rectifier, which is a special case of a semiconductor controlled rectifier. In general, heavily doped means a semiconductor region having a concentration of 1e18 Acm$^{-3}$ or greater. Likewise, lightly doped means a semiconductor region having a concentration of less than 1e18 Acm$^{-3}$. In both cases, the doped regions may be formed by ion implantation or other methods as are well known to those having ordinary skill in the art. Furthermore, the drawing figures are not to scale but are drawn to clearly illustrate important features of the present invention. In the following discussion, the term "electrically connected"

means an ohmic current path exists between two or more cited elements and does not preclude the existence of resistors, parasitic elements, or other circuit elements within the current path as is well known in the art.

The SCR of FIG. 4A is formed on P-type substrate (PSUB) 200. N-type buried layer (NBL) 101 is formed in PSUB 200 below the surface preferably by ion implantation. Taken together n-type well (NWELL) 100 and NBL 101 form an isolated p-type region (PSUB) 102 with the same impurity type and concentration as PSUB 200. The SCR includes P+ anode 108 formed in NWELL 100 and N+ cathode 114 formed in p-type well region 104. N+ region 106 electrically connects NWELL region 100 to reference terminal 122, which may be VSS, ground, or another suitable reference terminal. Reference terminal 122 is also connected to P+ anode 108 and gate region 110. P+ region 112 electrically connects p-type well 104 to terminal 120, which may be an input, output, input-output, or another reference terminal. Terminal 120 is also connected to N+ cathode 114. Active P+ regions 112 and 108, N+ regions 114 and 106, and the channel region below gate 110 are separated by shallow trench isolation (STI) regions 402 and 404. STI region 404 may optionally be omitted to improve the gain of the horizontal SCR.

The present inventors have discovered one of the problems with the SCR of FIGS. 1-3 is the limited operating voltage at terminal 120 with respect to reference terminal 122. Present analog circuits may require an operating voltage of −10 V or more at terminal 120 with respect to reference terminal 122. For small feature sizes, however, it was discovered that −6 V applied to terminal 120 with respect to reference terminal 122 would fully deplete lightly doped PSUB region 102 and cause collector-emitter punch through of NPN transistor 306. This problem is solved by a first embodiment of the present invention in which p-type region (PBL) 400 is preferably formed by ion implantation between p-type region 104 and NBL 101. PBL 400 is preferably formed with an impurity concentration between that of p-type region 104 and PSUB 102. If the PBL concentration is too low, collector-emitter punch through of NPN transistor 306 may still occur within the operating voltage range of terminal 120. Alternatively, if the concentration of PBL 400 is too high, lateral collector-base avalanche conduction of NPN transistor 302 will occur.

Figure 4B:
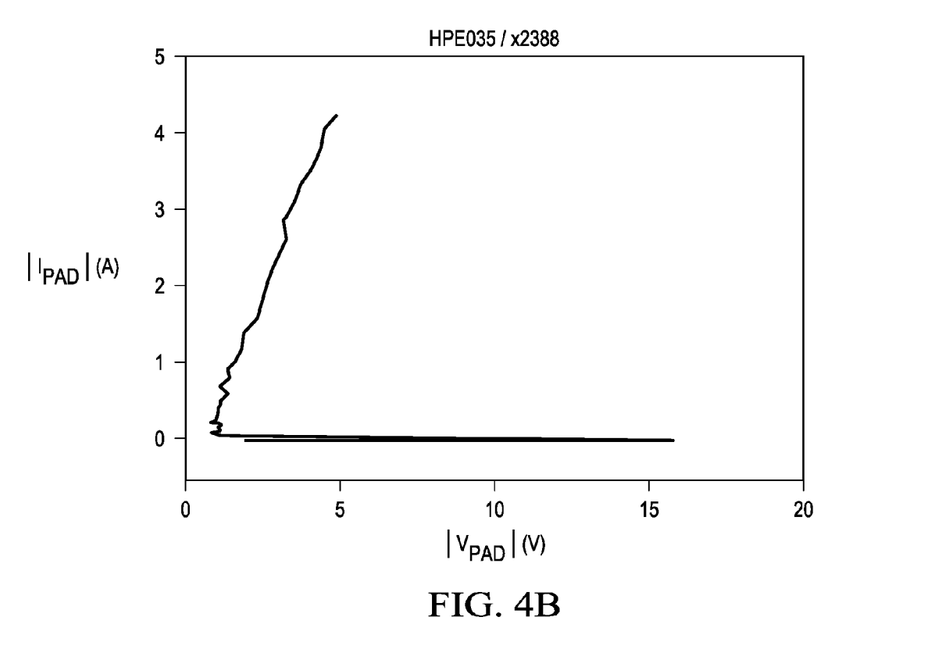
FIG. 4B is a current-voltage diagram of the SCR of FIG. 4A.

Referring now to FIG. 4B, there is a current-voltage diagram of the SCR of FIG. 4A. The absolute voltage at terminal 120 with respect to terminal 122 is shown along the horizontal axis. The absolute current between terminal 120 and 122 is shown along the vertical axis. It is important to note that the trigger voltage of the SCR is now 16 V, rather than 6 V, with no evidence of collector-emitter punch through. Moreover, the holding voltage of the SCR is less than 1 V to provide effective protection against electrostatic discharge (ESD).

Figure 5A:
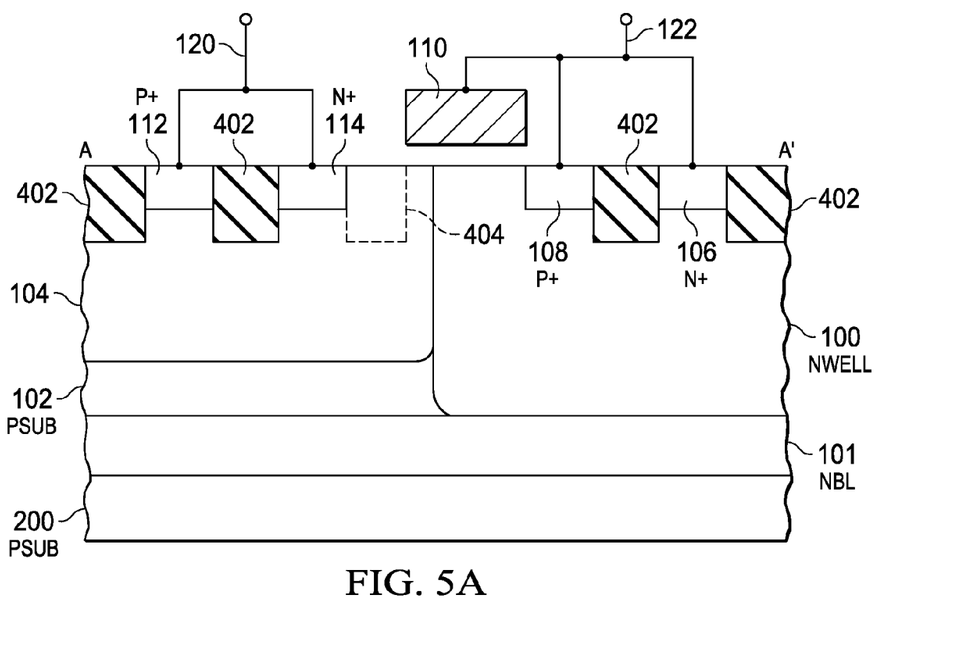
FIG. 5A is a cross sectional diagram of a second embodiment of the SCR of the present invention.
Figure 5B:
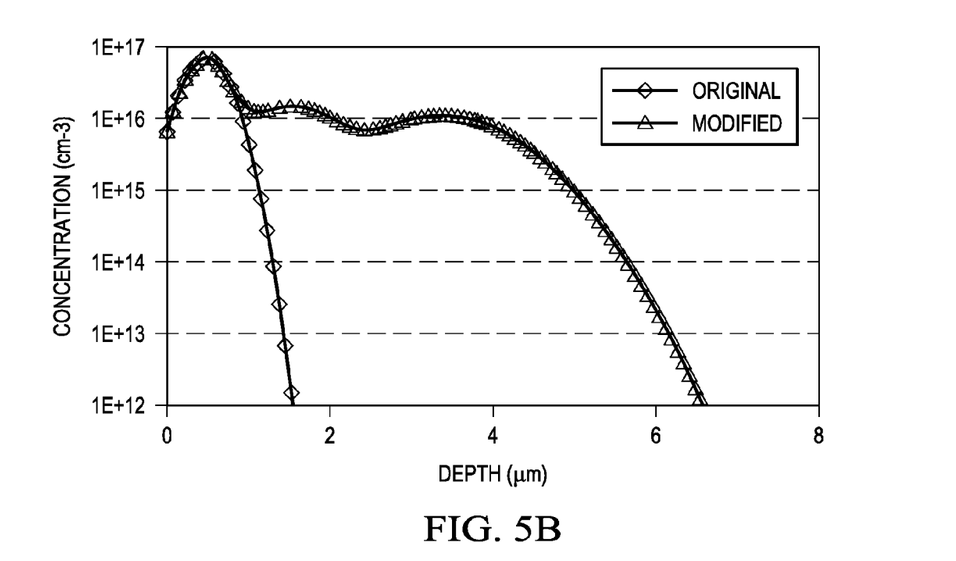
FIG. 5B is a doping profile of p-type well 104 of FIG. 5A.

Turning now to FIG. 5A, there is a second embodiment of the present invention. Here, however, p-type well layer 104 is modified according the impurity concentration diagram of FIG. 5B. The original doping profile is produced by a Boron implant dose of 4e12 Acm$^{-2}$ and energy of 15 keV. In addition, a second Boron implant dose of 1.8e12 Acm$^{-2}$ and energy of 47 keV and a third Boron implant dose of 2e12 Acm$^{-2}$ and energy of 115 keV are performed. The three implants produce three respective overlapping Gaussian distributions of FIG. 5A. The first and original implant produces a maximum concentration of 1.8e16 Acm−3 at 0.5 μm. The second implant produces a maximum concentration of 1.5e16 Acm−3 at 1.6 μm. The third implant produces a maximum concentration of 1.0e16 Acm−3 at 3.4 μm. The resulting doping profile of FIG. 5A advantageously prevents collector-emitter punch through of NPN transistor 306 to −20 V at terminal 120 with respect to reference terminal 122. The progressively decreasing concentration of Boron with increasing implant depth advantageously prevents collector-base avalanche conduction of NPN transistor 306. Since the maximum Boron concentration of the second and third implants is no greater than the original implant, no lateral collector-base avalanche of NPN transistor 302 will occur. Finally, no additional masks are required for the second and third Boron implants.

Figure 6A:
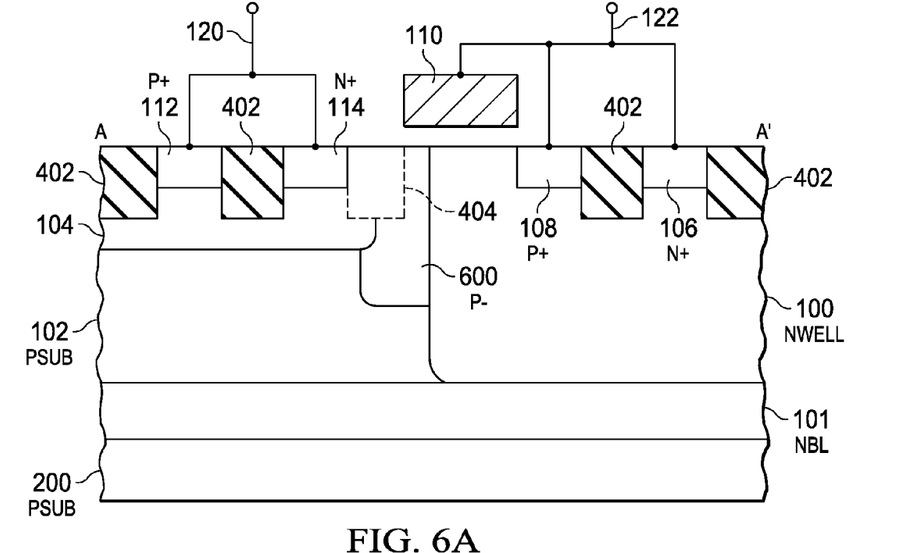
FIGS. 6A-6C are cross sectional diagrams of a third embodiment of the SCR of the present invention.

Referring now to FIG. 6A, there is a first part of a third embodiment of the present invention. The operating voltage of the SCR of FIGS. 1-3 is limited by the electric field between gate 110 and p-type well region 104. This limitation becomes increasingly significant as the dielectric thickness under gate 110 decreases. In the embodiment of FIG. 6A, gate 110 may be necessary when a metal silicide layer is formed over active regions 106, 108, 112, 114, and gate 110. The gate 110 prevents metal silicide formation that might otherwise short p-type well region 104 to NWELL 100. In the embodiment of FIG. 6A, a lightly doped p-type well region 600 is formed by ion implantation between p-type well region 104 and NWELL 100. P-type well region 600 is electrically connected to p-type well region 104 and extends NWELL 100. Region 600 is preferably more lightly doped than either of p-type well region 104 or NWELL 100 to avoid avalanche conduction with NWELL 100. During normal circuit operation, when terminal 120 is negative with respect to terminal 122, an inversion layer connected to NWELL 100 forms at the surface of p-type well region 600. This advantageously avoids any high electric field across the dielectric layer under gate 110 during normal circuit operation as well as during ESD events.

Figure 6B:
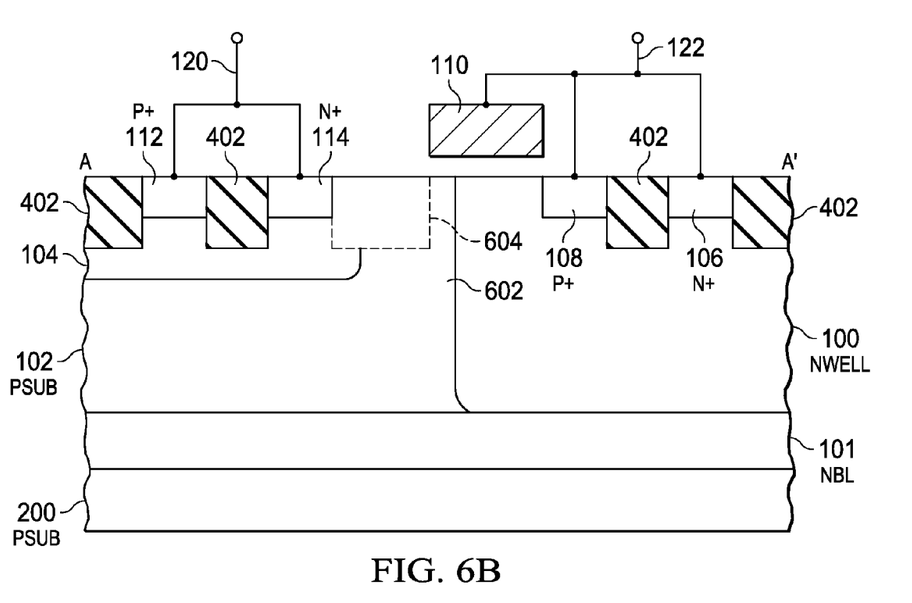

FIG. 6B is a second part of the third embodiment of the present invention. Here, when the space between SCR anode 108 and cathode 114 is sufficiently large it is possible to omit implant region 600 so that region 602 is an extension of PSUB 102. Isolation region 604 may also be optionally omitted to improve the gain of the horizontal SCR. As with FIG. 6A, an inversion layer connected to NWELL 100 forms at the surface of p-type region 602. This advantageously avoids any high electric field across the dielectric layer under gate 110 during normal circuit operation as well as during ESD events.

Figure 6C:
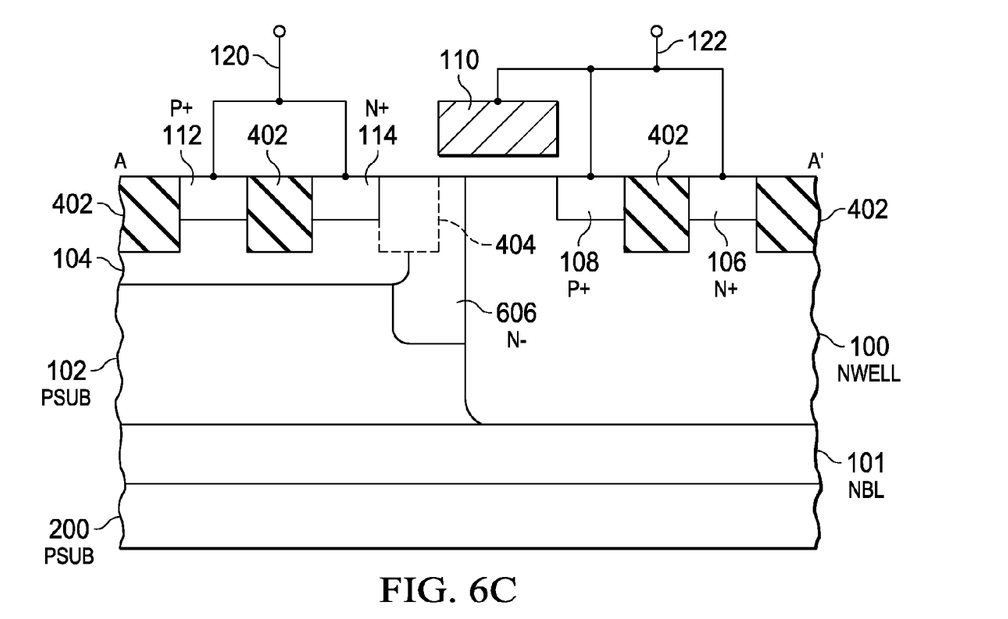

FIG. 6C is a third part of the third embodiment of the present invention. In the embodiment of FIG. 6C, a lightly doped n-type well region 606 is formed by ion implantation between p-type well region 104 and NWELL 100. N-type well region 606 is electrically connected to NWELL 100 and extends to p-type well region 104. Region 606 is preferably more lightly doped than either of p-type well region 104 or NWELL 100 to avoid avalanche conduction with p-type well region 104. During normal circuit operation, when terminal 120 is negative with respect to terminal 122, region 606 under gate 110 remains in accumulation and connected to NWELL 100. This advantageously avoids any high electric field across the dielectric layer under gate 110 during normal circuit operation as well as during ESD events. Alternatively, when not limited by punch through and avalanche conduction, NWELL 100 may be extended to the left to underlie gate 110.

Figure 7:
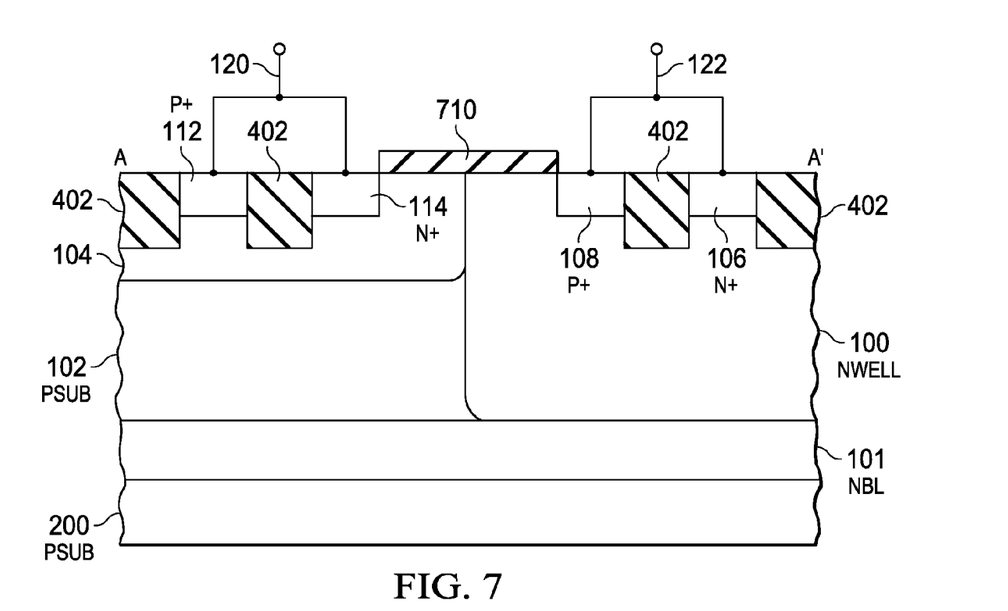
FIG. 7 is a cross sectional diagram of a fourth embodiment of the SCR of the present invention.

Referring next to FIG. 7, there is a fourth embodiment of the present invention. Here, gate 110 and STI 404 (FIG. 6) are removed. Silicide blocking layer 710 is formed over portions of p-type well region 104 and NWELL 100 between N+ cathode 114 and P+ anode 108. The silicide blocking layer is preferably a thin deposited dielectric layer such as $SiO_2$ or a composite dielectric of $SiO_2$ and SiN. The silicide blocking layer 710 advantageously prevents formation of metal silicide that would otherwise short p-type well 104 to NWELL 100.

Moreover, gate 110 is removed so there is no high electric field across the dielectric layer 710 during normal circuit operation as well as during ESD events. Removal of STI region 404 advantageously improves the gain of the lateral SCR (FIG. 3) by creating a more direct collector-emitter current path for NPN transistor 302.

Figure 8:
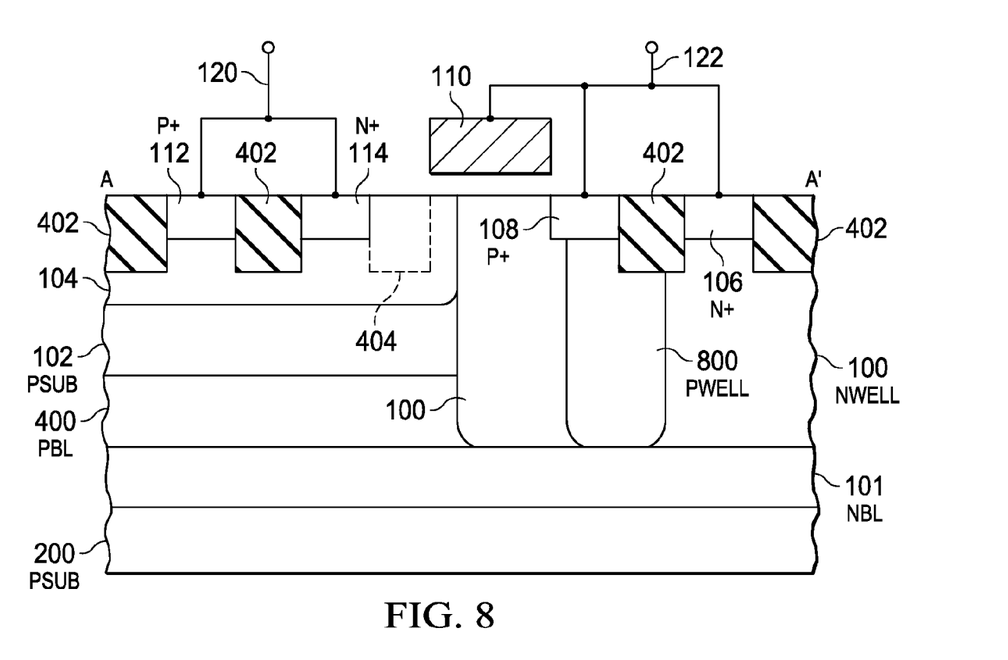
FIG. 8 is a cross sectional diagram of a fifth embodiment of the SCR of the present invention.

Referring now to FIG. 8, there is a fifth embodiment of the present invention. Recall from the discussion of FIG. 3 that resistor 301 is a base-emitter shunt resistor for lateral PNP transistor 300. The present inventors have determined that the gain, trigger voltage, and holding voltage of the lateral SCR formed by PNP transistor 300 and NPN transistor 302 are significantly affected by the value of shunt resistor 301. In order to improve these characteristics of the SCR, p-type (PWELL) region 800 is formed by ion implantation below and electrically connected to P+ anode 108. PWELL region 800 has a slightly higher impurity concentration than NWELL 100 and preferably extends to NBL 101. However, one of ordinary skill in the art having access to the instant specification will understand that SCR characteristics are improved even when PWELL 800 extends any distance below P+ anode 108. This improvement is due to an increase in the value of resistor 301, since the current path through resistor 301 must flow through NWELL 100, below PWELL 800, and up to N+ well contact 106. Therefore, the maximum increase in the value of resistor 301 is advantageously achieved when PWELL 800 extends to NBL 101.

Still further, while numerous examples have thus been provided, one skilled in the art should recognize that various modifications, substitutions, or alterations may be made to the described embodiments while still falling within the inventive scope as defined by the following claims. For example, although the foregoing discussion is specifically directed to an SCR having a negative operating voltage at terminal 120 with respect to reference terminal 122, embodiments of the present invention are equally applicable to an SCR having a positive operating voltage at an input, input-output, or output terminal such as terminal 122 with respect to a reference terminal such as terminal 120. Moreover, although five embodiments of the present invention have been discussed separately, it is to be understood that many of them may be combined in a single improved SCR. Other combinations will be readily apparent to one of ordinary skill in the art having access to the instant specification.

What is claimed is:

1. A semiconductor controlled rectifier, comprising:
a first lightly doped region having a first conductivity type;
a first heavily doped region having a second conductivity type formed within the first lightly doped region, the first heavily doped region forming an anode of the semiconductor controlled rectifier;
a second lightly doped region having the second conductivity type formed at a first time proximate the first lightly doped region;
a second heavily doped region having the first conductivity type formed within the second lightly doped region, the second heavily doped region forming a cathode of the semiconductor controlled rectifier;
a fourth heavily doped region having a first conductivity type formed within the first lightly doped region and electrically connected to the first heavily doped region;
a fifth heavily doped region having a second conductivity type formed within the second lightly doped region and electrically connected to the second heavily doped region;
shallow trench isolation regions between and separating the first, second, fourth and fifth heavily doped regions;
wherein the shallow trench isolation region is omitted from between the first heavily doped region and the second heavily doped region;
a gate formed over a junction between the first lightly doped region and the second lightly doped region;
a buried layer having the first conductivity type formed below the second lightly doped region and electrically connected to the first lightly doped region;
a third lightly doped region having the second conductivity type formed at a second time between the second lightly doped region and the buried layer;
a fourth lightly doped region having the second conductivity type formed at a third time between the second lightly doped region and the buried layer and electrically connected to the second and third lightly doped regions;
wherein the second lightly doped region in combination with the third lightly doped regions and the fourth lightly doped region form the bases of the NPN transistors of the semiconductor controlled rectifier;
wherein the first lightly doped region in combination with the buried layer form the bases of the PNP transistors of the semiconductor controlled rectifier; and
also wherein the semiconductor controlled rectifier is formed on a substrate having the second conductivity type, and wherein the second lightly doped region is electrically isolated from the substrate by the first lightly doped region and the buried layer.

2. The semiconductor controlled rectifier as in claim 1, comprising the fifth heavily doped region coupled to the second heavily doped region.

3. The semiconductor controlled rectifier as in claim 1, wherein the gate is electrically connected to the first heavily doped region and coupled to the first lightly doped region and the buried layer by way of the fourth heavily doped region.

4. A electrostatic discharge (ESD) protection circuit with a dual semiconductor controlled rectifier (SCR) comprising:
an N+ cathode region and a P+ region located in a p-type well region (PWELL), the N+ cathode region and P+ region electrically connected to a first terminal;
a P+ anode region and an N+ region located in an n-type well region (NWELL), the P+ anode region and the N+ region electrically connected to a second terminal;
an n-type buried layer below the PWELL and electrically connected to the NWELL;
an isolated portion of a p-type substrate between the PWELL and the n-type buried layer;
a p-type buried layer between the PWELL and the n-type buried layer.

5. The ESD protection circuit of claim 4, wherein the dual SCR further comprises a gate located across a boundary of the NWELL and PWELL.

6. The ESD protection circuit of claim 5, wherein the dual SCR further comprises:
a first shallow trench isolation structure between and directly touching the N+ cathode region and the P+ region;
a second shallow trench isolation structure between and directly touching the P+ anode region and the N+ region, wherein no shallow trench isolation structures are located between the N+ cathode region and the P+ anode region.

7. The ESD protection circuit of claim 4, wherein the isolated portion of the p-type substrate has the same impurity type and concentration as the p-type substrate.

8. The ESD protection circuit of claim 4, wherein the p-type buried layer is located between the isolated portion of the p-type substrate and the n-type buried layer.

* * * * *